US012688338B1

(12) United States Patent
Hannon et al.

(10) Patent No.: US 12,688,338 B1
(45) Date of Patent: Jul. 21, 2026

(54) OPTIMIZED WIRING AND NETWORK CABLE ROUTING IN BUILDING INFORMATION MODELING ENVIRONMENTS

(71) Applicant: eVolve MEP, LLC, Brookhaven, GA (US)

(72) Inventors: Matthew Hannon, Atlanta, GA (US); Adam Heon, Atlanta, GA (US)

(73) Assignee: eVolve MEP, LLC, Brookhaven, GA (US)

( * ) Notice: Subject to any disclaimer, the term of this patent is extended or adjusted under 35 U.S.C. 154(b) by 0 days.

(21) Appl. No.: 19/097,512

(22) Filed: Apr. 1, 2025

(51) Int. Cl.
*G06F 30/18* (2020.01)

(52) U.S. Cl.
CPC .................................... *G06F 30/18* (2020.01)

(58) Field of Classification Search
CPC ...... G06F 30/18; G06F 30/12; G06F 2111/00; G06F 2119/22
See application file for complete search history.

(56) References Cited

U.S. PATENT DOCUMENTS

| | | | | |
|---|---|---|---|---|
| 6,080,206 | A * | 6/2000 | Tadokoro | .............. G06F 30/394 |
| | | | | 716/124 |
| 11,100,257 | B2 * | 8/2021 | Faulkner | .............. G06F 3/0482 |

| | | | | |
|---|---|---|---|---|
| 2007/0159984 | A1 * | 7/2007 | Hentschke | .............. H04L 45/00 |
| | | | | 370/254 |
| 2010/0146473 | A1 * | 6/2010 | Srivastava | ............ G06F 30/394 |
| | | | | 716/129 |
| 2024/0005055 | A1 * | 1/2024 | Sakai | ...................... G06Q 50/04 |
| 2024/0193329 | A1 * | 6/2024 | Fulton | .................... G06F 30/18 |

* cited by examiner

*Primary Examiner* — Kibrom K Gebresilassie
(74) *Attorney, Agent, or Firm* — Clayton, McKay & Bailey, PC

(57) ABSTRACT

An automated wiring run generation plugin for a building computer-aided design ("CAD") program is disclosed. The plugin receives user-defined pathways within a model layout and identifies start and end points requiring connections, accessing a run schedule as needed. It evaluates possible routes by detecting pathway segments within a threshold distance that have an open, orthogonal path to equipment elements. The plugin then generates line segments connecting equipment to pathways and determines the shortest route for each start/end point pairing using a shortest path algorithm or individual segment calculations. A directed weighted graph can be used to optimize routing. The plugin then visually generates and displays the shortest wiring or conduit runs on the graphical user interface ("GUI") based on user settings. This automation streamlines the wiring design process, reducing manual effort and minimizing errors while ensuring efficient cable routing within CAD and BIM environments.

20 Claims, 7 Drawing Sheets

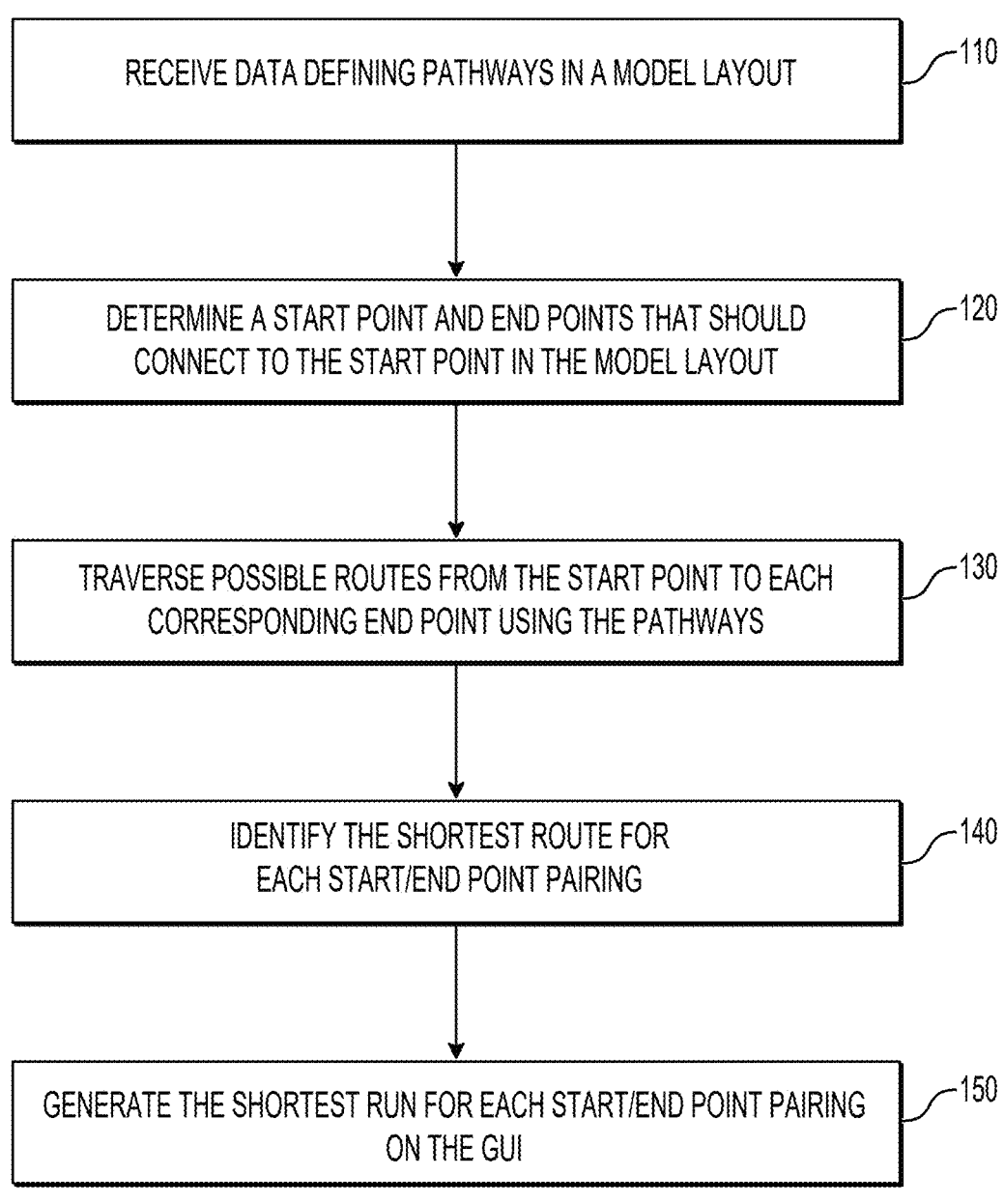

RECEIVE DATA DEFINING PATHWAYS IN A MODEL LAYOUT ⟋110

DETERMINE A START POINT AND END POINTS THAT SHOULD CONNECT TO THE START POINT IN THE MODEL LAYOUT ⟋120

TRAVERSE POSSIBLE ROUTES FROM THE START POINT TO EACH CORRESPONDING END POINT USING THE PATHWAYS ⟋130

IDENTIFY THE SHORTEST ROUTE FOR EACH START/END POINT PAIRING ⟋140

GENERATE THE SHORTEST RUN FOR EACH START/END POINT PAIRING ON THE GUI ⟋150

*FIG. 1*

OPTIMIZED WIRING AND NETWORK CABLE ROUTING IN BUILDING INFORMATION MODELING ENVIRONMENTS

BACKGROUND

Construction of a building, or group of buildings, is often a huge, complex project that includes numerous subcontractors coming in to perform specific work at specific times. A substantial amount of preplanning is required to ensure that the right subcontractors and materials are in the right place and at the right time. A master schedule is generally created to help manage all the parts and people involved. Schedules typically include a list of activities that must be performed, a location where the activity where each activity is to be performed, and a date range when the activity is to be performed.

Building Information Modeling ("BIM") software, such as AUTODESK REVIT, is widely used in architecture, engineering, and construction for designing and managing building systems. One critical aspect of BIM modeling involves planning and routing wiring, network cables, and other bulk wiring systems within a building layout. Traditionally, this process has been performed manually, requiring users to individually place and connect each cable run, a method that is both time-consuming and susceptible to human error.

In conventional workflows, users must manually determine the appropriate pathways for wiring, identify the best connection points for equipment, and ensure efficient routing while avoiding conflicts with other building elements. This manual process requires significant expertise and iterative adjustments to optimize cable routing, which can lead to inconsistencies, inefficiencies, and design errors. This is a very time-consuming process prone to user error, requiring a user to draw tens of runs, each possibly going from one end of the model to another.

As a result, a need exists for an improved method for routing wiring in a BIM model.

SUMMARY

Examples described herein include systems and methods for automating the generation of wiring and network cable runs within a model layout. The plugin enhances efficiency by automating the process of defining, routing, and optimizing wiring pathways based on user-defined inputs, thereby reducing design time and minimizing human error.

"Wiring" and "cable runs" can also be called "raceways." Raceways can include conduit, cable trays, and the like.

In one embodiment, a graphical user interface ("GUI") receives data defining at least one pathway having multiple segments in a model layout of a building CAD program. The pathway can have multiple different segments that are either connected or disconnected. For purposes of this disclosure, the term pathway can include multiple pathways. These pathways can be manually created by a user within the GUI, such as by drawing lines that represent pathway segments, the multiple segments together being considered the pathway. The pathway segments serve as predefined routes for wiring and network cable runs. Once the pathways are established, the plugin determines start points and corresponding end points that should connect to them. This can be done by accessing a run schedule, which contains data on equipment elements that require connections. The equipment elements can be provided as either start points or end points.

The plugin then traverses possible routes between each start point and its corresponding end point. To accomplish this, the plugin identifies all pathway segments that are within a threshold distance from the equipment elements and have an open, orthogonal path between the equipment and the pathway. The plugin then creates a line segment connecting each equipment element to the nearest available pathway.

Next, the plugin determines the shortest route for each start/end point pairing. This can be achieved using a shortest path algorithm or by calculating individual segments separately. In one approach, the plugin constructs a directed weighted graph representing each possible route and feeds the graph into a shortest path algorithm to identify the most efficient wiring run.

Finally, the plugin generates and displays the shortest wiring run for each start/end point pairing on the GUI. The generated runs, which may include wiring, conduits, or cable trays, are visually represented within the model layout based on user-defined settings. By automating this process, the invention streamlines the design workflow, ensures accurate and efficient wiring layouts, and enhances overall project coordination within BIM environments.

The examples summarized above can each be incorporated into a non-transitory, computer-readable medium having instructions that, when executed by a hardware-based processor associated with a computing device, cause the processor to perform the stages described. Additionally, the example methods summarized above can each be implemented in a system including, for example, a memory storage and a computing device having a processor that executes instructions to carry out the stages described.

Both the foregoing general description and the following detailed description are exemplary and explanatory only and are not restrictive of the examples, as claimed.

BRIEF DESCRIPTION OF THE DRAWINGS

Reference will now be made in detail to the present examples, including examples illustrated in the accompanying drawings. Wherever possible, the same reference numbers will be used throughout the drawings to refer to the same or like parts.

FIG. 1 is a flowchart of an example method for generating routes in a model layout.

DESCRIPTION OF THE EXAMPLES

Reference will now be made in detail to the present examples, including examples illustrated in the accompanying drawings. Wherever possible, the same reference numbers will be used throughout the drawings to refer to the same or like parts.

The present invention relates to a software plugin for a building computer-aided design ("CAD") program, such as REVIT, that automates the creation of wiring and network cable runs within a model layout. The plugin allows users to define pathways within a GUI, which serve as designated routes for bulk wiring. Once the pathways are established, the plugin identifies start and end points that require connections by accessing a run schedule. It then analyzes possible routes by detecting pathway segments within a threshold distance that maintain an open, orthogonal path to the equipment elements. The plugin generates line segments connecting each equipment element to the nearest pathway, ensuring logical integration within the model.

To determine the optimal wiring routes, the plugin calculates the shortest path for each start/end point pairing using either a shortest path algorithm or by evaluating each segment individually. In one approach, it constructs a directed weighted graph representing possible routes and applies a shortest path algorithm for optimization. Once the optimal paths are determined, the plugin generates and displays the shortest wiring or conduit runs within the GUI, visually representing the connections based on user-defined settings. By automating the wiring layout process, the invention reduces manual effort, minimizes human error, and enhances design efficiency within BIM environments.

Figure 4:
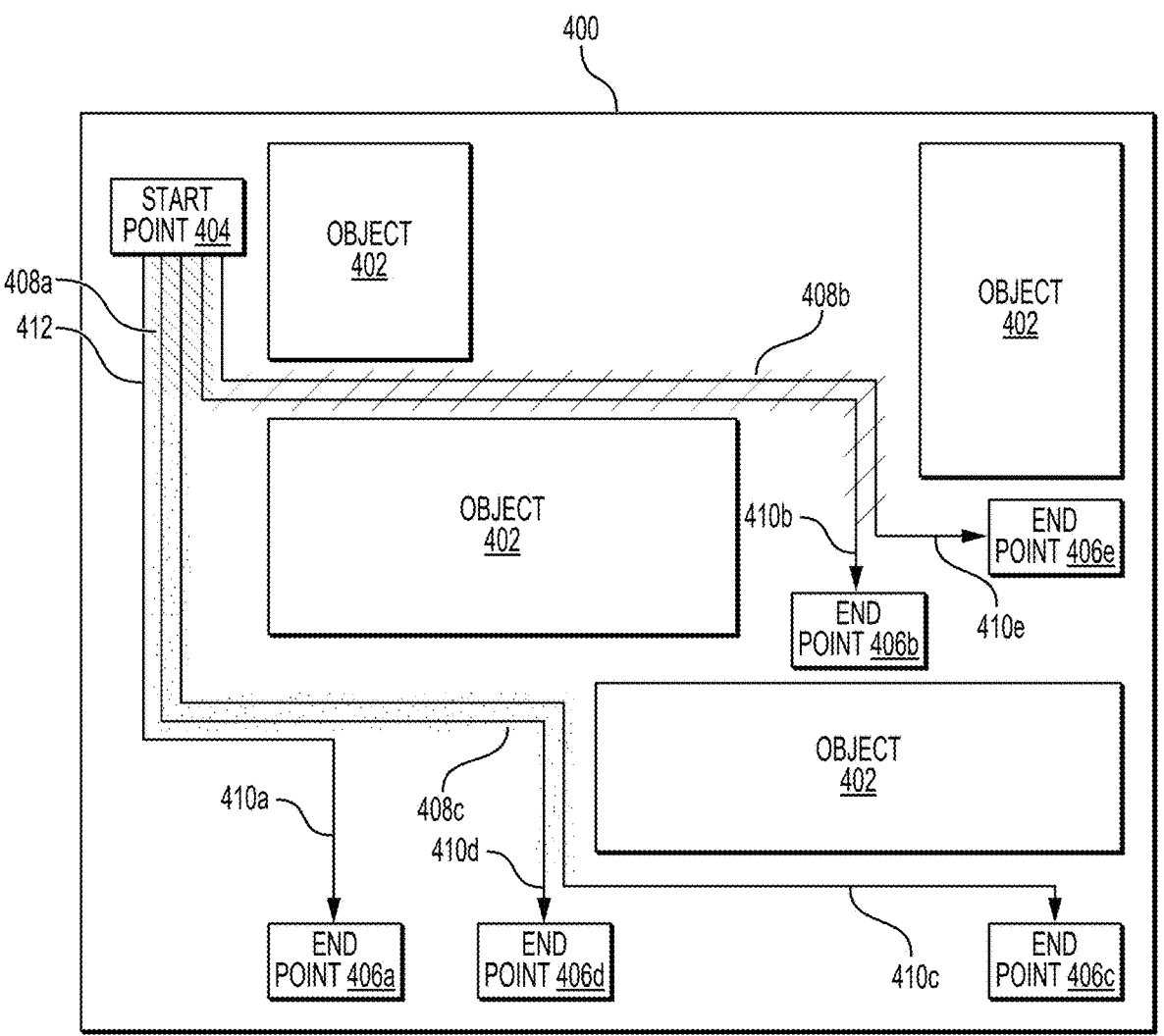
FIG. 4 is an illustration of an example GUI for generating routes in a model layout.

FIG. 1 is a flowchart of an example method for generating routes in a model layout. At stage 110, a GUI can receive data defining pathways in a model layout of a building CAD program, such as REVIT. The model layout can be a detailed design and arrangement of spaces, walls, doors, windows, furniture, and structural elements on a specific level of a building. Pathways can be user-defined segments through which the bulk of wiring runs. A plugin for the CAD program can provide functionality that allows a user to draw the pathways for bulk wiring. FIG. 4, described later herein, includes an example illustration of these pathways.

The pathways can be segmented. For example, the plugin can require that the pathways are drawn in straight lines. The user can draw multiple segments based on the layout of the floor. Each segment can connect to one or more segments at a vertex. Vertices can represent where two or more segments connect, such as at a turn or branch in a pathway.

References are made throughout to terms related to electrical equipment, such "wires," "conduit," "panels," and so on. However, this is merely exemplary and not meant to be limiting in any way. For example, references to electrical equipment can also refer to mechanical, network communication, plumbing, and other equipment. As an example, references to "bulk wiring" or "conduit" can include pipes for plumbing and network cables like Ethernet cables.

At stage 120, a plugin can determine a start point and end points that should connect to the start point in the model layout. The plugin can retrieve this data from the CAD program. For example, the CAD program can include run schedules that are used to organize and display information about various system runs within a model layout. Some examples of run schedules include conduit run schedules for electrical systems to track conduit paths, cable tray run schedules for electrical and communication wiring pathways, duct run schedules used for heating, ventilation, and air conditioning ("HVAC") systems to manage airflow distribution, pipe run schedules used for plumbing, fire protection, and mechanical piping, and so on. The plugin can make an Application Programming Interface ("API") call to the CAD program to retrieve the run schedule. The plugin can then identify all the start points and end points based on the data in the run schedule.

Table 1 below is an example conduit run schedule used for exemplary purposes:

TABLE 1

| Conduit Run Schedule | | | | | | | | |
|---|---|---|---|---|---|---|---|---|
| Run ID | Start | Finish | Conduit Standard | Parallel Qty | Conduit Size | Conduit Fill | Modeled Length | Wire Length |
| FR-01 | PNL-1 | PNL-2 | EMT | 2 | 3" | 19.26% | 141'-6 7/8" | 141'-6 7/8" |
| FR-02 | PNL-1 | PNL-3 | EMT | 2 | 3" | 19.26% | 47'-10 7/8" | 47'-10 7/8" |
| FR-03 | PNL-1 | PNL-4 | EMT | 2 | 3" | 31.40% | 147'-1 23/32" | 147'-1 23/32" |
| FR-04 | PNL-2 | PNL-2A | EMT | 2 | 3" | 31.40% | 1'-6" | 1'-6" |
| FR-05 | PNL-3 | PNL-3A | EMT | 2 | 3" | 31.40% | 109'-1 15/32" | 109'-1 15/32" |
| FR-06 | PNL-4 | PNL-2A | EMT | 2 | 3" | 31.40% | 180'-6 3/16" | 180'-6 3/16" |

The "Run ID" column includes an identifier ("ID") unique to a specific run. The "Start" column includes an ID for the equipment that is the start point for the run. The "Finish" column includes an ID for the equipment that is the end point for the run. The Conduit Standard" column indicates the type of conduit used in the run. The "Parallel Qty" column indicates the number of identical conduit runs that follow the same path. The "Conduit Size" column indicates the size the conduit. The "Conduit Fill" column indicates what percentage of space inside the conduit is filled by wires. The "Modeled Length" column indicates the length of conduit needed based run modeled using the methods described herein. The "Wire Length" column indicates the length of wire needed based the modeled runs.

The plugin can require that certain fields are properly filled before runs can be generated. For example, the Run ID field can be required so that the run can identified. The Start and Finish fields can be required so that the plugin can determine which devices to connect to each other. The Conduit Standard, Parallel Qty, and Conduit Fill columns can be required so that the plugin knows how which conduit size to use and parallel quantity (indirectly spacing) to allow for each run. If the user enters the wrong conduit size, such that the conduit fill is over 40%, then the plugin can still place the conduits according to user specified values in an example.

Some columns, such as the Modeled Length and Wire Length columns, can be empty before the plugin generates the runs. These fields can be filled by the plugin after generating the runs.

At stage 130, the plugin can traverse possible routes from each start point to each corresponding end point using the pathways. To do this, the plugin can first logically connect the start point to the closest pathway segment. The plugin can then logically connect the end point to the closest pathway segment. Logically connecting two entities (e.g., a start/end point and pathway segment) can include establishing a programmatic relationship between them. This can include building a table of connected entities, including coordinates, such that the plugin can cause the GUI to connect the entities with the appropriate type of element or assembly (e.g., pipe, conduit, duct, etc.). Element types can include electrical (e.g., conduit, wiring, and electrical assemblies), mechanical (e.g., plumbing and air ducts), and network (e.g., network cable, conduit, and routers).

When logically connecting a start/end point to a pathway segment, the plugin can first determine whether and how many pathway segments are within a threshold distance of the start/end point. For each pathway segment within the threshold distance, the plugin can identify a location on the pathway segment that is closest to the start/end point and create a vertex at that location. The plugin can also create a line segment between the start/end point and the vertex. This can result in multiple possible routes between the start and end point.

At stage 140, the plugin can identify the shortest route for each start/end point pairing. In an example, the plugin can identify the shortest routes by applying a shortest path algorithm to the possible routes for each start/end point pairing. The shortest path algorithm can traverse the possible routes, adding up the lengths for each segment in a route. The shortest path algorithm can output which route would create the shortest run.

At stage 150, the plugin can generate the shortest run for each start/end point pairing on the GUI. For each pathway section, the plugin can calculate where along the section that conduits for a run need to be placed. Since a section can contain tees, elbows, and other fittings, a run may not need to be placed along the entire length of the segment. Also, a run may enter a section at one tee and leave it at another.

Part of generating runs can include determining the physical layout of the conduits that will be placed on the run. This considers the size of the conduit and the user configured spacing. The plugin can produce a list of two dimensional ("2D") points for each run. The list represents a vertical slice along the section (when converted back into three dimensions ("3D"), the points are on a plane orthogonal to the section's line) and the points show where the run's conduits will be placed.

The plugin can then determine which specific conduit type it will use for each run it will place. The plugin can then place the conduits for each run on each section using the lists of points calculated above to determine the conduit's location (a run's list of 2D points is evaluated at the segments where it enters and exits the section, resulting in 3D start and end points for the conduits) and the run's data to determine the conduit's type and size. The plugin can then connect the placed conduits and assign the corresponding Run ID to the conduits.

Figure 2:
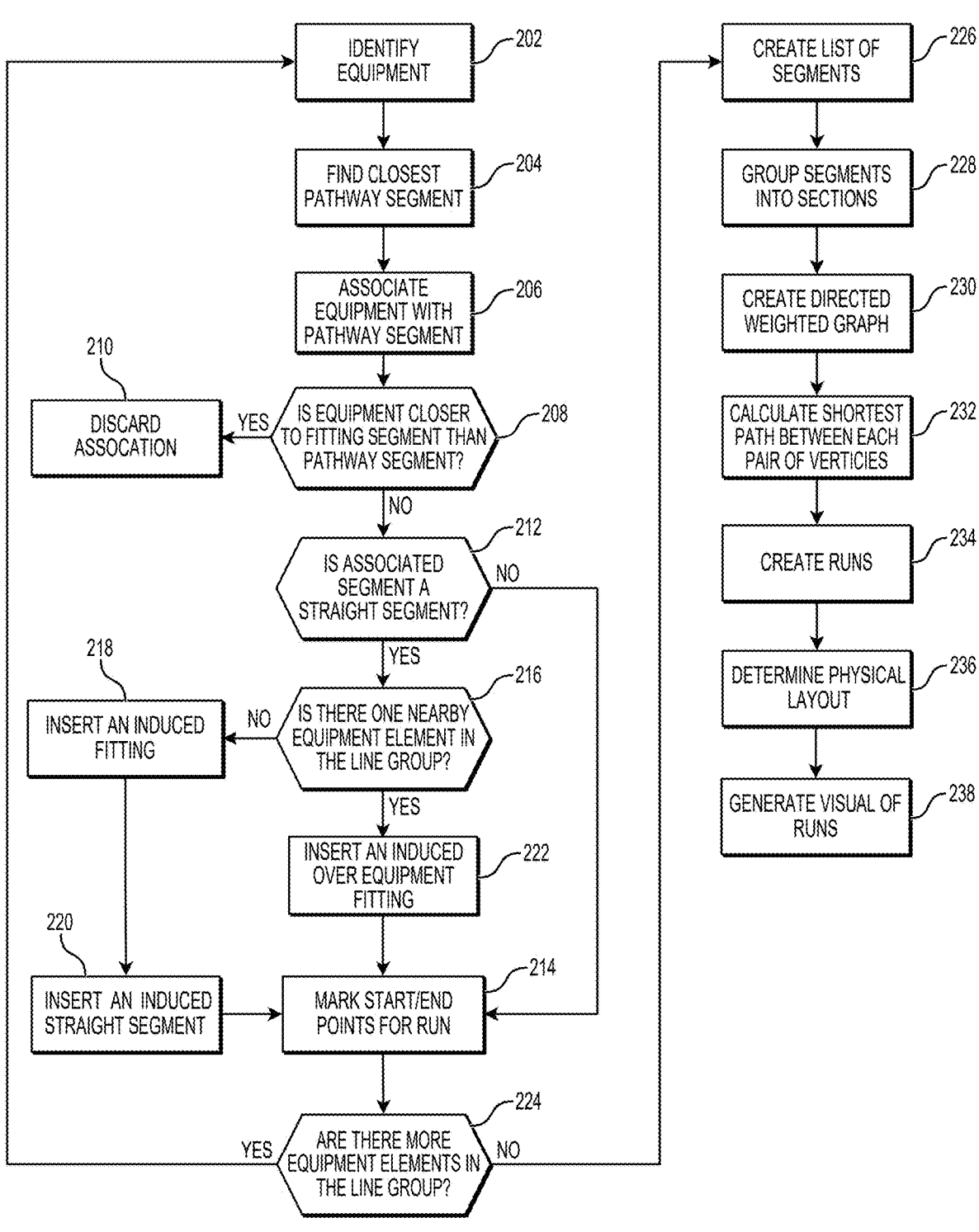
FIG. 2 is a flowchart of another example method for generating routes in a model layout.

FIG. 2 is a flowchart of another example method for generating routes in a model layout. At stage 202, a plugin can identify an equipment element that needs to be connected to a pathway. An equipment element can be any piece of equipment that is a start point or end point for a run. As an example, for electrical runs, equipment elements can include electrical panels, light switches, plugs, and so on. For plumbing equipment, equipment elements can include faucets, toilets, drains, a water heater and so on. For network equipment, equipment elements can include routers, switches, ports, and so on.

In an example, the plugin can identify the equipment element using a run schedule, such as a conduit run schedule, network cable run schedule, plumbing run schedule, and so on. The run schedule can identify start and end points in a model layout. Each start point and end point can correspond to an equipment element. The run schedule can include pairings of start and end points. The plugin can be configured to ignore duplicate equipment element IDs in the run schedule. This can occur when, for example, an equipment element is the start point or end point for multiple runs.

As an example, in the Conduit Run Schedule of Table 1, the equipment element PNL-1 is the start point for three different runs, and PNL-2A is the end point for two different runs. The plugin can identify the unique equipment element IDs in the run schedule to avoid redundancy.

In an example, the plugin can create a list of unique element Ids from the run schedule and process them one at a time.

At stage 204, the plugin can find the closest pathway segment to the equipment element. In one example, the plugin can do this by identifying each pathway segment within a predetermined threshold distance from the equipment element. If there are multiple pathway segments within the threshold distance, then the plugin can measure the straight-line distance to each pathway segment and select the closest one. Restrictions can be put on how the straight-line distance is measured. For example, wiring, cables, and plumbing are generally run orthogonally so that they are parallel and/or perpendicular to the exterior walls. Also, many fittings are orthogonal, such as elbows, t-fittings, and cross fittings. For at least these reasons, the plugin can be configured to measure the shortest orthogonal distance to the pathway segment.

The plugin can be configured to avoid any obstacles. For example, if there is an obstacle between the element and the pathway segment at the shortest orthogonal point, then, if possible, the plugin can make orthogonal turns to go around the obstacle. This can change the location on the segment that would be closest to the element. In one example, if finding a line with orthogonal line to the segment is not possible, then the plugin can search for another pathway segment.

If there is no pathway segment within the threshold distance, then the plugin can cause an error to be displayed on the GUI. The error can identify the equipment element and indicate to the user that there is no pathway segment close enough to the equipment element. The user can then draw a new pathway segment, or modify an existing pathway segment, to bring a pathway segment closer to the equipment element.

At stage 206, the plugin can associate the end point with the pathway segment. For example, the plugin can create a vertex at the location on the pathway segment that is closest to the equipment element and create a logical programmatic relationship between the vertex and the equipment element. The programmatic relationship can indicate that the vertex and element orthogonally connect to each other.

At stage 208, the plugin can determine whether the equipment element is closer to a fitting segment than a location on the pathway segment. Fitting segments can be placed at any location along a pathway, such as at a vertex where a pathway turns or branches. The vertex is also referred to as a "node." If the equipment element is closer to a fitting segment, then, at stage 210, the plugin can discard the association created at stage 206. The plugin can create a new association of the equipment element with the fitting segment. If necessary, the plugin can modify the fitting segment to accommodate the equipment element. For example, the plugin can change an elbow to a t-joint, or a t-joint to a cross joint.

In one example, stages 206-210 could be merged. The plugin can create a vertex if the closest pathway is not already a vertex.

At stage 212, the plugin can determine whether the associated segment is a straight segment. If not, then, at stage 214, the plugin can mark the end point for creating a run. This can occur, as an example, where a pathway segment ends at the equipment element. In this instance, no additional fitting is required at the pathway segment, so the end of the run can be marked.

When the closest pathway segment is a straight, if the straight is above or below the equipment, an induced over equipment segment can be inserted into the straight. This splits the straight into two straights. Otherwise, an induced fitting is inserted (for example, either a tee or cross, depending on if there's equipment on one or both sides of the straight).

If the associated segment is a straight segment, then, at stage 216, the plugin can determine whether the end point is close to the pathway segment. If not, then, at stage 218, the plugin can insert an induced fitting, such as a t-joint or an elbow joint. An induced fitting can be a fitting that diverts from the pathway segment toward the equipment element where an additional line segment is required between the pathway segment and the equipment element. At stage 220, the plugin can then insert an induced straight segment between the induced fitting and the equipment element. The plugin can then mark the equipment element as at end of the run at stage 214.

For stages 214-222, if an induced fitting was placed, then the plugin can draw an induced straight from the fitting to one or more adjacent equipment elements. If there are multiple equipment elements in a row, the plugin can place induced fittings over equipment segments, repeating this for all but the last equipment element in the line. For example, the placements can look like: [Induced Fitting]-[I. Str.]-[I/ Eq]-[I. Str.]-[I/Eq.]-[I. Str.]-(Last Equipment).

If the end point is close to the pathway segment at stage 218 (i.e., the equipment element can connect directly to the pathway), then, at stage 222, the plugin can insert an induced over equipment fitting. An induced over equipment fitting is a fitting in the pathway that connects directly to the equipment element. The plugin can then mark the induced over equipment fitting as the end of a run at stage 214.

At stage 224, the plugin can determine whether there are more end points that need to be connected. If so, then the plugin returns to stage 202 and identifies the next equipment element to connect. Technically, stage 224 can include two loops. The plugin executes a first loop to find the closest pathway segments for each piece of equipment. Next those associations are grouped together based on sharing the same pathway segment. For straights, this is based on how far the closest point on the straight for one equipment is from the closest point on the straight for another equipment. These grouped equipment-segment pairings (each segment has one or more equipment elements) are then processed by the plugin in a second loop that creates the induced fittings and induced over equipment segments as needed.

After all equipment elements have been connected to the pathway, at stage 226, the plugin can create a list of all segments in a continuous order. For example, given an initial sequence where branches (represented by brackets) extend from tee connections-such as "a b c[1 2 3 [A B] 4] d e f [5 6 7] g h"—the algorithm processes the segments to produce a reordered list in which the main sequence is maintained, and branches are appended in a structured manner. In this case, the resulting ordered list would be "a b c d e f g h 1 2 3 4 A B 5 6 7," ensuring that all segments are included while preserving continuity.

At stage 228, the plugin can group the segments into sections. A section can consist of one or more segments arranged in a straight line. A section can contain tees, crosses, and induced over equipment segments.

At stage 230, the plugin can create a directed weighted graph for the pathway segments. In the graph, pathway fitting segments (e.g., not straight segments) are vertices. The edges are created from the straights connected to the fittings, with the weight being the lengths. Because a pathway is logically an undirected graph, the plugin can create a 'reversed' version for each edge, with the same length but with the start and end vertices swapped.

At stage 232, the plugin can calculate the shortest path between each pair of vertices. To do this, the plugin can feed the direct weighted graph into a shortest path algorithm. The shortest path algorithm can find the shortest path between each start/end point pairing that follows the straight segments from vertex to vertex. The algorithm can then output the shortest path in a format readable by the plugin.

At stage 234, the plugin can create the runs. For example, the shortest path algorithm can output an ordered list of segments that make up the shortest path for a run. For each straight segment in the path, the plugin can mark the straight segment as containing that run. The plugin can also mark the fitting segments in the path as containing that run.

The plugin can calculate where along the section it needs to place conduits for that run. Since a section can contain tees and other fittings, a run might not need to be placed along the entire section. One part of this calculation can include determining where along the section the run will be placed. For instance, a run may enter the section at one tee and leave it at another.

At stage 236, the plugin can determine the physical layout of each run. This considers the size of the conduit, and the user configured spacing. This part of the calculation can produce a list of 2D points for each run. The list represents a vertical slice along the section (when converted back into 3D, the points are on a plane orthogonal to the section's line) and the points show where the run's conduits will be placed.

The plugin can then determine which specific conduit type to use for each run. The plugin can then place the conduits for each run on each section using the lists of points calculated above to determine the conduit's location (a run's list of 2D points is evaluated at the segments where it enters and exits the section, resulting in 3D start and end points for the conduits) and the run's data to determine the conduit's type and size. The plugin can then connect the placed conduits to each other.

At stage 238, the plugin can generate a visual of the runs in the model layout. The plugin can display the runs within the model layout with distinct color coding, annotations, and interactive elements for user modification. The generated visualization can update in real-time based on design modifications and user-defined parameters, facilitating efficient planning, coordination, and error mitigation within the digital model.

Figure 3:
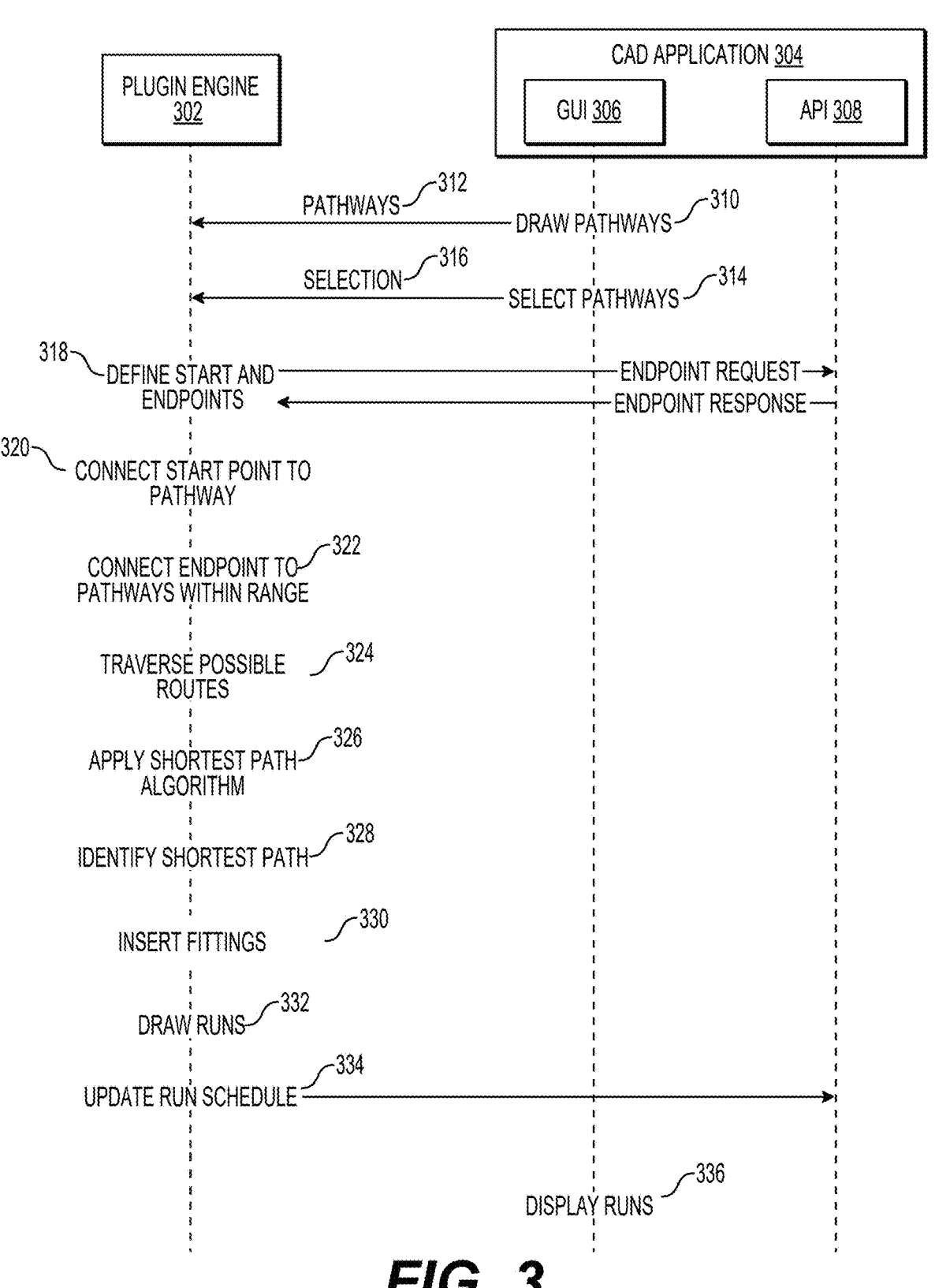
FIG. 3 is a sequence diagram of an example method for generating routes in a model layout.

FIG. 3 is a sequence diagram of an example method for generating routes in a model layout. The sequence diagram includes a plugin 302. At stage 310, a GUI 306 of a CAD application 304 can receive user inputs for drawing pathways in a model layout. The model layout can be defined using the CAD application 304. The GUI 306 can display the model layout, and the user can draw the pathways on the model layout. The GUI 306 can send data defining the user-drawn pathways to the plugin 302 at stage 312.

At stage 314, the GUI 306 can receive user selections of pathways for creating routes. For example, the GUI 306 can provide a window with the possible runs that can be created in a model layout. The possible runs can be based on data from a run schedule associated with the model layout. For example, the run schedule can define start and end points for each possible run. The GUI 306 can display a selectable list of the possible runs, and the user can select which runs to create. The GUI 306 can send data defining the selected runs to the plugin 302 at stage 316.

At stage 318, the plugin 302 can define start and end points. In an example, the plugin 302 can retrieve the information necessary for defining the start and end points by making an API call to the API 308 of the CAD application 304. As an example, each run can have a unique run ID. The data sent by the GUI 306 at stage 316 can include the run IDs of the selected runs. The plugin 302 can then make an API call to the API 308 with the run IDs. The API 308 can respond with the run schedule information for those run IDs.

Because an equipment element needs to connect to a pathway segment only once, the plugin 302 can identify each unique equipment ID that is a start point and each unique equipment ID that is an end point.

At stage 320, the plugin 302 can logically connect the start points to pathway segments. For example, the plugin 302 can identify all pathway segments that are within a predetermined threshold distance from the start point. Then plugin 302 can then determine whether there is an open path to draw a line orthogonally from the pathway segment to the start point. If so, then the plugin 302 can mark the location of the pathway segment as a vertex and create a line segment from the vertex to the start point.

If a pathway segment begins at a start point, then the plugin 302 can logically associate that end of the pathway segment with the start point.

At stage 322, the plugin 302 can logically connect the end points within range of pathway segments. The plugin 302 can do this in the same manner as the start points described above. For example, the plugin 302 can identify all pathway segments that are within a predetermined threshold distance from the end point. Then plugin 302 can then determine whether there is an open path to draw a line orthogonally from the pathway segment to the end point. If so, then the plugin 302 can mark the location of the pathway segment as a vertex and create a line segment from the vertex to the start point. If not, then the plugin 302 can ignore the pathway segment.

At stage 324, the plugin 302 can traverse possible routes for each start/end point pairing. For example, the plugin 302 can begin at a start point and traverse through the vertices until it reaches the corresponding end point. In one example, the plugin can create a direct weighted graph that consists of vertices, directed edges, and weights. The vertices represent any start point, end point, turn, or branch in the route. The directed edges represent arrows connecting the vertices and indicate a direction between them. Each edge can have an associated numerical weight, which can represent distance of the edge.

At stage 326, the plugin 302 can apply a shortest path algorithm to the routes. For example, the plugin 302 can feed the direct weighted graph for each route into a shortest path algorithm. Alternatively, the plugin 302 can calculate the length of each path separately.

At stage 328, the plugin 302 can identify the shortest path for each start/end point pairing. In an example, this can be the output from the shortest path algorithm. Alternatively, the plugin 302 can calculate the length of each route and identify the route with the shortest total length.

At stage 330, the plugin 302 can insert fittings. For example, as described previously, the plugin can insert vertices where a run branches from a pathway segment or where a pathway segment branches from another pathway segment. The plugin 302 can determine the appropriate induced fitting to replace the vertex. For example, if a run turns orthogonally toward a start or end point from the middle of a pathway segment, then the plugin 302 can insert an elbow joint and discontinue the remaining portion of the pathway segment for that run. If some wire or cable branches off while others continue forward, then the plugin 302 can insert a t-joint. In instances where runs branch out in three directions, the plugin can insert a cross joint.

In one example, the plugin can create virtual induced fittings before finding the shortest path. These virtual induced fittings are not actually inserted for display in the model, but instead are only used for the path calculations.

At stage 332, the plugin 302 can draw runs between the start/end point pairings. For example, the plugin 302 can determine the physical layout of each run. This considers the size of the conduit, and the user configured spacing. This part of the calculation can produce a list of 2D points for each run. The list represents a vertical slice along the section (when converted back into 3D, the points are on a plane orthogonal to the section's line) and the points show where the run's conduits will be placed.

The plugin can then determine which specific conduit type to use for each run. The plugin can then place the conduits for each run on each section using the lists of points calculated above to determine the conduit's location (a run's list of 2D points is evaluated at the segments where it enters and exits the section, resulting in 3D start and end points for the conduits) and the run's data to determine the conduit's type and size. The plugin can then connect the placed conduits to each other.

At stage 334, the plugin 302 can update a run schedule. Using TABLE 1 as an example, the Modeled Length and Wire Length can be empty before the runs are created. The plugin 302 can fill these fields with the lengths calculated while creating the routes.

At stage 336, the GUI 306 can display the runs in the model layout.

FIG. 4 is an illustration of an example GUI for generating routes in a model layout 400. The model layout 400 is detailed design and arrangement of spaces, walls, doors, windows, furniture, and structural elements on a specific level of a building. The model layout 400 includes objects 402, that represent any object that can obstruct the path of a run. Some examples of objects 402 can include pillars, an open space from a floor below, HVAC ducts, and so on.

The model layout 400 includes a single start point 404, which is an equipment element from where a run 412 starts. However, a model layout can include multiple start points 404. The model layout 400 also includes multiple end points 406 (represented by end points 406*a-e*). The line segments 410*a-e* are part of the created runs 412. End points 406*a-e* are equipment elements from where a run 412 ends. As an example, the start point 404 can be an electrical panel and end points 406*a-e* can be various electrical fixtures. In another example, the start point 404 can be a network switch, and the end points 406*a-e* can be network ports. Although not shown, equipment elements can be both a start point 404 and an end point 406. As an example, a floor can contain two or more network switches. The first set of network cables can run from a first network switch to a second network switch, and a second set of network cables can run from the second network switch to network ports. In this example, the second network switch is an end point 406 for one run and a start point 404 for other runs.

The model layout 400 includes a pathway made up of pathway segments 408*a-c*. Pathway segments 408*a-c* are user-drawn segments that represent paths through which bulk runs 412 (e.g., conduits, network cables, pipes, and so on) will follow. The plugin creating the runs 412 can be configured to orthogonally connect the end points 406a-e to the nearest pathway segment 408a-c.

When generating runs 412, the plugin creates line segments 410a-e that connect the end points 406 to the pathway segments 408. For example, line segment 410a orthogonally connects end point 406a to the pathway segment 408c. Also, line segment 410e connects end point 406e to the pathway segment 408b. In the model layout 400, all runs 412 will pass through pathway segment 408a. The runs 412 for end points 406a, 406d, and 406c connect to the pathway segment 408c, and the runs 412 for end points 406b and 406e connect to the pathway segment 408b.

In some examples, an end point can connect to another end point rather than directly a pathway segment. For example, the end point 406c could connect to the end point 406d rather than the pathway segment 408c.

When rendering routes in a GUI, the plug can display the runs 412. The pathway segments 408 can be overlayed on the runs 412 so that the user can determine whether a pathway segment 408 should be modified. The plugin can determine the physical layout of each run and space the runs 412 based on user-defined settings. For example, if the runs 412 are for electrical conduit, the plugin can display the runs 412 as conduit with their widths and the distance between each conduit based on information provided in a conduit run schedule.

Figure 5:
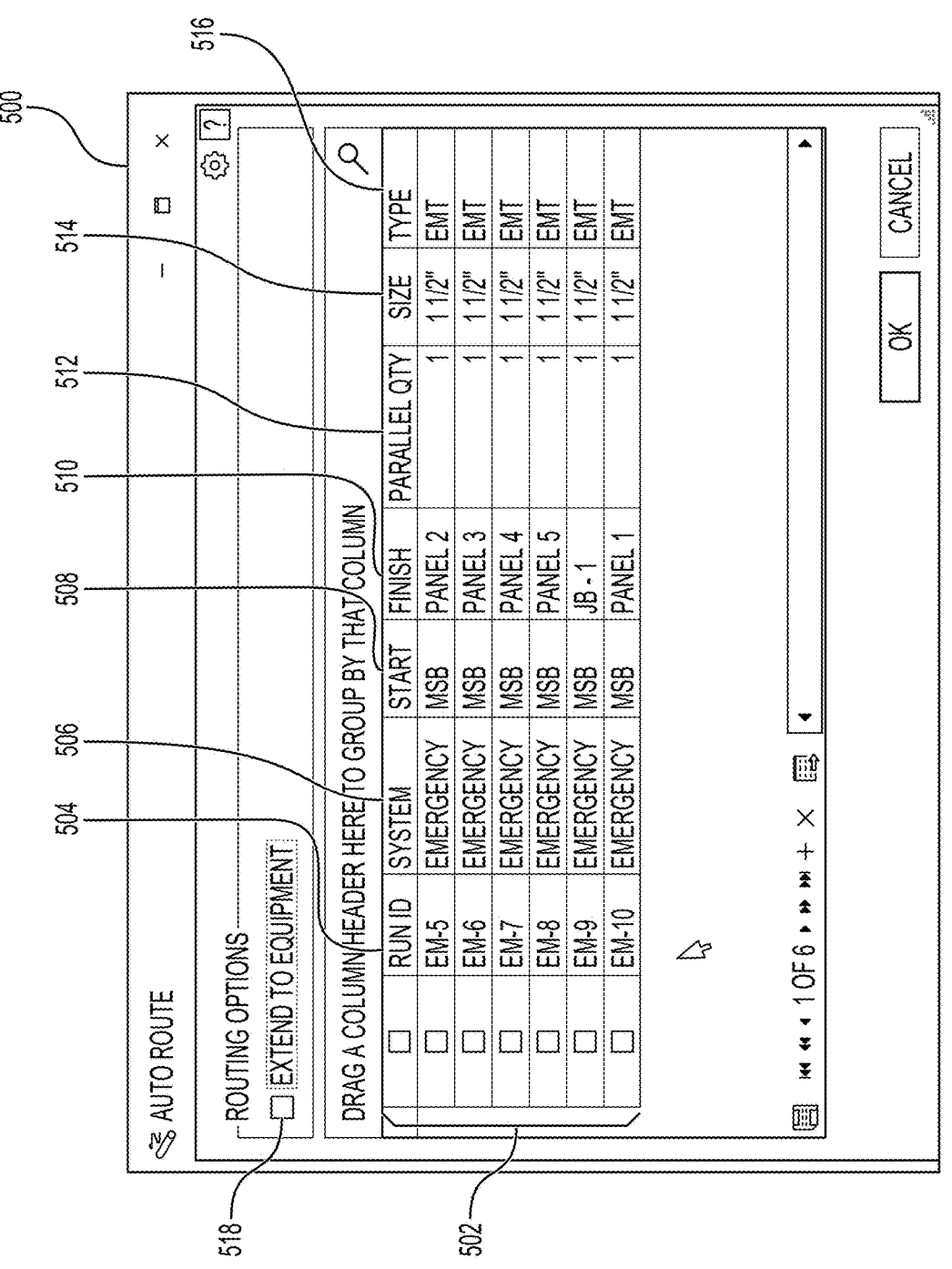
FIG. 5 is an illustration of another example GUI for generating routes in a model layout.

FIG. 5 is an illustration of an example GUI 500 for selecting runs to generate in a model layout. The GUI 500 can include a runs list 502 that includes all possible runs that can be created in a model layout. The available runs can be limited to a specific portion of a building model, such as a single floor and portion of a building floor. The runs list 502 can include information populated from a run schedule. The runs list 502 is for running electrical conduit. For each run, the runs list 502 includes a Run Id field 504 that includes the ID unique to the run, a system field 506 indicating what system the run is for, a start field 508 that identifies the start point, a finish field 510 that identifies the end point, a parallel quantity field 512 that indicates how many parallel conduits are included in the run, a size field 514 that indicates the size of the conduits, and a type field 516 that indicates the type of conduit.

The GUI 500 includes a selectable extend to equipment option 518 that, when selected, causes the plugin to extend the placed conduit to the end point equipment. The option 518 may not be selected when, for example, the wiring can run from a pathway to an end point without conduit. This can affect the type of fitting used at certain vertices. For example, if the option 518 is selected, then the plugin can insert an elbow joint and run the conduit directly into the end point. The conduit length and wire length would be the same. However, if the option 518 is not selected, then a junction box may be required instead of a joint. Also, the wire length would be calculated all the way to the end point, but the conduit length would be calculated to the junction box.

Figure 6:
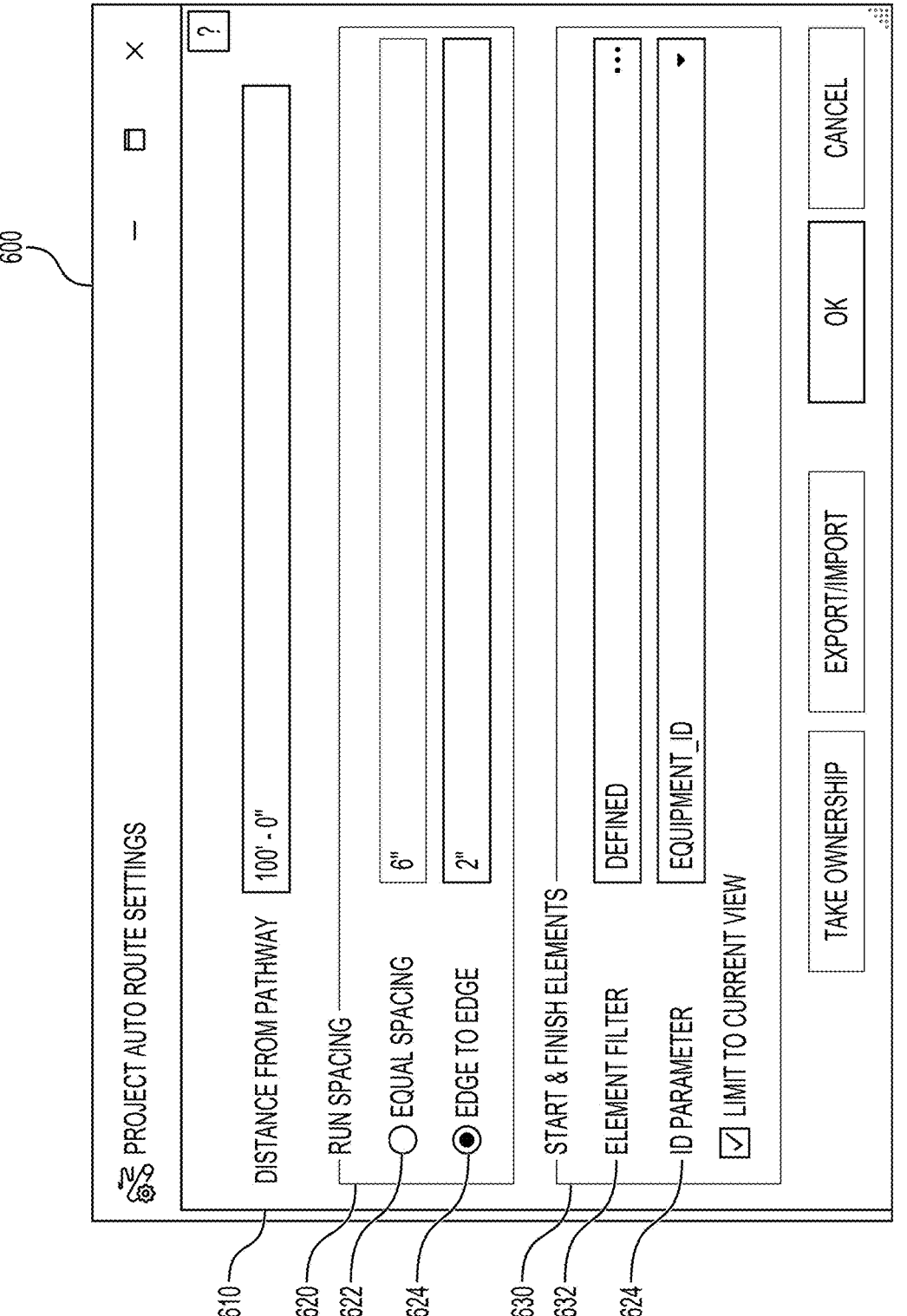
FIG. 6 is an illustration of another example GUI for generating routes in a model layout.

FIG. 6 is an illustration of another example GUI 600 for configuring route generation in a model layout. The GUI 600 includes a Distance from Path field 610 where a user can designate the threshold distance that an end point must be from a pathway. The plugin can traverse routes through all pathway segments within the distance provided in the Distance from Path field 610.

The GUI 600 includes Run Spacing setting 620. This can include an Equal Spacing option 622 and an Edge to Edge option 624. If the Equal Spacing option 622 is selected, the runs are separated by a designated distance between their centers, regardless of their width. For example, when generating conduit runs for display, the plugin will separate each conduit by the center-to-center distance in the Equal Spacing option 622, regardless of the width of each conduit. If the Edge to Edge option 624 is selected, then the plugin will separate each conduit based on the designated distance between their outside edges.

The GUI 600 includes a Run Spacing setting 620, which can offer options for how to space the runs relative to each other. The Run Spacing setting in the GUI 600 includes two options: Equal Spacing 622 and Edge-to-Edge 624. When the Equal Spacing option 622 is selected, runs are spaced based on a specified center-to-center distance, irrespective of their width. For instance, when generating conduit runs for display, the plugin ensures each conduit is separated by the designated center-to-center distance defined in the Equal Spacing option 622. Alternatively, if the Edge-to-Edge option 624 is selected, the plugin spaces each conduit according to the specified distance between their outer edges.

The GUI 600 includes a Start and Finish Elements setting 630, which includes an Element Filter 632 and an ID parameter 634. The plugin can cause these to display within the GUI 600 by making API calls to the CAD application, such as REVIT. The Element Filter 632 allows a user to select what types of elements to include in the run generation, such as conduit fittings, electrical equipment, cable tray fittings, communications devices, mechanical equipment, and so on. The ID parameter 634 allows a user to select which parameter to use for the equipment IDs.

Figure 7:
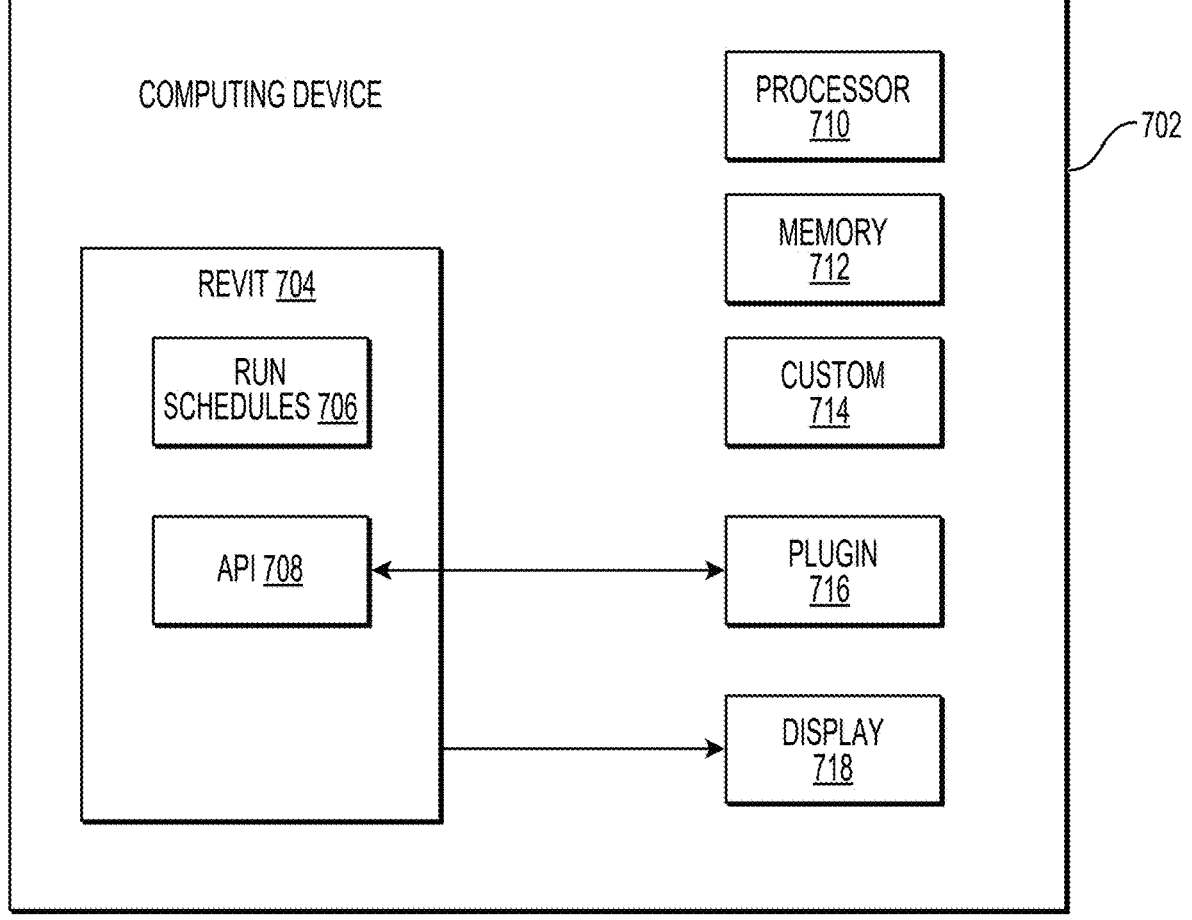
FIG. 7 is an illustration of an example system diagram for generating routes in a model layout.

FIG. 7 is an illustration of example system components used in communication between REVIT and the plugin. The plugin 716 communicates with REVIT 704 using the REVIT API 708. This can include implementing methods of the API 708 to divert functionality to the plugin. For example, custom drop-down list items can be added for automating routes in a model layout. The functionality for doing so can be carried out, in part, in the plugin 716. The plugin 716 can access run schedules 706. The run schedules 706 can be numerous and selected for particular applications, such as ordering parts or building assemblies in the field. The run schedules 706 can include run configuration information for particular component families (e.g., electrical systems, network systems, HVAC systems, plumbing systems, and so on). This can mean that different run schedules are available for different families. The plugin 716 can select a run schedule based on the runs selected by a user, for example.

The plugin 716 can run the route-finding process described with regard to FIGS. 1, 2, and 3 to attempt to determine the shortest path between start points and end points using pathways drawn by a user.

The computing device 702 can be any processor-based device, such as a personal computer, workstation, server, phone, or laptop. The computing device 702 can include a processor 710 and memory 712. The processor 710 can be one or more physical processors that are local to the computing device 702 or virtual computer processing units that are accessed remotely. The memory 712 can be non-transitory and can store instructions for execution by the processor 710.

The processor 710 can run a computer-aided design application, such as REVIT 704. REVIT 704 can include the run schedules 706. REVIT 704 can also generate a GUI for use with a display 718. The display 718 can be any type of screen and can be integrated into the computing device 702 or separate from the computing device 702.

REVIT 704 can utilize the plugin 716 to add functionality. The plugin 716 can make API 708 calls to REVIT 704 to integrate itself within the workflow. This can include altering the GUI and providing additional functional items, such as menu items and buttons, for use with the auto-dimensioning. The plugin 716 can receive information, such as run information, from REVIT 704, and send back dimensional information. The plugin 716 can also update run schedules 706, in an example.

Although a plugin is described in some examples, the computer-aided application, such as REVIT, can alternatively build the described functionality directly into the application. The examples can still apply to that scenario as well. Additionally, though REVIT is referred to for convenience, the examples can also function with any other computer-aided design application.

Other examples of the disclosure will be apparent to those skilled in the art from consideration of the specification and practice of the examples disclosed herein. Though some of the described methods have been presented as a series of steps, it should be appreciated that one or more steps can occur simultaneously, in an overlapping fashion, or in a different order. The order of steps presented are only illustrative of the possibilities and those steps can be executed or performed in any suitable fashion. Moreover, the various features of the examples described here are not mutually exclusive. Rather any feature of any example described here can be incorporated into any other suitable example. It is intended that the specification and examples be considered as exemplary only, with a true scope and spirit of the disclosure being indicated by the following claims.

What is claimed is:

1. A method for generating routes in a model layout, comprising:

receiving, in a graphical user interface ("GUI"), user inputs defining a pathway with multiple segments in the model layout, wherein the pathway represents a potential placement location for an element type that is not yet placed in the pathway within the model layout, wherein the element type is one of electrical, mechanical, and network;

selecting a run schedule in the GUI;

automatically determining a start point and end points within the model layout from the run schedule, wherein the run schedule identifies runs of the element type, each run having end points; and without human intervention, at least:

automatically constructing, within the model layout, possible routes from the start point to the end points, wherein the start and end points are not connected within the model layout prior to the constructing, the constructing comprising:

determining a first location on a first segment of the pathway that is closest to the start point;

logically connecting the start point to the first location, the connection creating a vertex;

for each end point, determining a second location on a second segment of the pathway that is closest to the end point; and logically connecting the end points to their respective second locations;

for each end point, identifying a shortest route along the pathway to the start point, wherein the shortest route is restricted from leaving the pathway except along one or more of the logical connections; and automatically generating, on the GUI, the shortest route for each end point, including placing and displaying parts of the element type along the respective shortest route.

2. The method of claim 1, wherein constructing routes from the start point to the end points further comprises inserting nodes at the first location and the second locations, and wherein each of the nodes is designated as an elbow joint, a t-joint, or a cross joint.

3. The method of claim 1, wherein a plugin causes the GUI to display a first option for drawing the pathway and a second option for filtering according to element type, wherein the multiple segments are drawn on the GUI by the user inputs.

4. The method of claim 1, wherein constructing routes from the start point to the end points further comprises, for each route:

applying a shortest path algorithm that graphs vertices along the pathway, including the vertex, wherein connections to the pathway are orthogonal; and identifying a shortest path between the start point and a corresponding end point that follows the pathway, wherein the route generated is based on the shortest path.

5. The method of claim 4, wherein, based on the shortest path algorithm, at least one end point logically connects to another end point without traversing the pathways between them.

6. The method of claim 1, wherein a plugin causes the GUI to receive the user inputs defining the pathway in the model layout to determine the routes, wherein the GUI is part of a computer-aided design ("CAD") application, wherein the plugin adds functionality of the CAD application to traverse the possible routes and generate the shortest routes, and wherein determining the start point and end points is based on an application programming interface ("API") call from the plugin to the CAD application.

7. The method of claim 1, further comprising updating the run schedule with materials and amounts needed for each route based on the displayed parts.

8. A non-transitory, computer-readable medium containing instructions that, when executed by a hardware-based processor, causes the processor to perform stages for generating routes in a model layout, the stages comprising:

receiving, in a graphical user interface ("GUI"), user inputs defining a pathway with multiple segments in the model layout, wherein the pathway represents a potential placement location for an element type that is not yet placed in the pathway within the model layout, wherein the element type is one of electrical, mechanical, and network;

selecting a run schedule in the GUI;

automatically determining a start point and end points within the model layout from the run schedule, wherein the run schedule identifies runs of the element type, each run having end points; and without human intervention, at least:

automatically constructing, within the model layout, possible routes from the start point to the end points, wherein the start and end points are not connected within the model layout, the constructing comprising:

determining a first location on a first segment of the pathway that is closest to the start point;

logically connecting the start point to the first location, the connection creating a vertex;

for each end point, determining a second location on a second segment of the pathway that is closest to the end point; and logically connecting the end points to their respective second locations;

for each end point, identifying a shortest route along the pathway to the start point, wherein the shortest route is restricted from leaving the pathway except along one or more of the logical connections; and automatically generating, on the GUI, the shortest route for each end point, including displaying parts of the element type along the respective shortest route.

9. The non-transitory, computer-readable medium of claim 8, wherein constructing routes from the start point to the end points further comprises inserting nodes at the first location and the second locations, and wherein each of the nodes is designated as an elbow joint, a t-joint, or a cross joint.

10. The non-transitory, computer-readable medium of claim 8, wherein a plugin causes the GUI to display a first option for drawing the pathway and a second option for filtering according to element type, wherein the multiple segments are drawn on the GUI by the user inputs.

11. The non-transitory, computer-readable medium of claim 8, wherein constructing routes from the start point to the end points further comprises, for each route:

applying a shortest path algorithm that graphs vertices along the pathway, including the vertex; and identifying a shortest path between the start point and a corresponding end point that follows the pathway, wherein the route generated is based on the shortest path.

12. The non-transitory, computer-readable medium of claim 11, wherein, based on the shortest path algorithm, at least one end point logically connects to another end point without traversing the pathways between them.

13. The non-transitory, computer-readable medium of claim 8, wherein a plugin causes the GUI to receive the user inputs defining the pathway in the model layout to determine the routes, wherein the GUI is part of a computer-aided design ("CAD") application that communicates with the plugin, and wherein determining the start point and end points is based on an application programming interface ("API") call from the plugin to the CAD application.

14. The non-transitory, computer-readable medium of claim 8, the stages further comprising updating the run schedule with materials and amounts needed for each route based on the displayed parts.

15. A system for generating routes in a model layout, comprising:

a processor that executes instructions for running a design application having an application programming interface ("API");

a memory that includes code for a plugin, the plugin interacting with the API to cause the processor to perform stages including:

receiving, in a graphical user interface ("GUI"), user inputs defining a pathway with multiple segments in the model layout, wherein the pathway represents a potential placement location for an element type that is not yet placed in the pathway within the model layout, wherein the element type is one of electrical, mechanical, and network;

selecting a run schedule in the GUI;

automatically determining a start point and end points within the model layout from the run schedule, wherein the run schedule identifies runs of the element type, each run having end points; and without human intervention, at least:

automatically constructing, within the model layout, possible routes from the start point to the end points, wherein the start and end points are not connected within the model layout, the constructing comprising:

determining a first location on a first segment of the pathway that is closest to the start point;

logically connecting the start point to the first location, the connection creating a vertex;

for each end point, determining a second location on a second segment of the pathway that is closest to the end point; and logically connecting the end points to their respective second locations;

for each end point, identifying a shortest route along the pathway to the start point, wherein the shortest route is restricted from leaving the pathway except along one or more of the logical connections; and automatically generating, on the GUI, the shortest route for each end point, including displaying parts of the element type along the respective shortest route.

16. The system of claim 15, wherein constructing routes from the start point to the end points further comprises inserting nodes at the first location and the second locations, and wherein each of the nodes is designated as an elbow joint, a t-joint, or a cross joint.

17. The system of claim 15, wherein a plugin causes the GUI to display a first option for drawing the pathway and a second option for filtering according to element type, wherein the multiple segments are drawn on the GUI by the user inputs.

18. The system of claim 15, wherein constructing routes from the start point to the end points further comprises, for each route:

applying a shortest path algorithm that graphs vertices along the pathway, including the vertex; and identifying a shortest path between the start point and a corresponding end point that follows the pathway, wherein the route generated is based on the shortest path.

19. The system of claim 18, wherein, based on the shortest path algorithm, at least one end point is logically connected to another end point without traversing the pathways between them.

20. The system of claim 15, wherein the plugin causes the GUI to receive the user inputs defining pathways in the model layout to determine the routes, wherein the GUI is part of a computer-aided design ("CAD") application that communicates with the plugin, and wherein determining the start point and end points is based on an API call from the plugin to the CAD application.

* * * * *